US010175321B2

(12) United States Patent
Chen et al.

(10) Patent No.: US 10,175,321 B2
(45) Date of Patent: Jan. 8, 2019

(54) ITERATIVE MAGNETIC RESONANCE FINGERPRINTING RECONSTRUCTION

(71) Applicant: Siemens Healthcare GmbH, Erlangen (DE)

(72) Inventors: Xiao Chen, Somerset, NJ (US); Mariappan S. Nadar, Plainsboro, NJ (US); Christopher Cline, Minneapolis, MN (US); Boris Mailhe, Plainsboro, NJ (US); Qiu Wang, Princeton, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 158 days.

(21) Appl. No.: 15/332,336

(22) Filed: Oct. 24, 2016

(65) Prior Publication Data

US 2017/0115368 A1 Apr. 27, 2017

Related U.S. Application Data

(60) Provisional application No. 62/245,566, filed on Oct. 23, 2015.

(51) Int. Cl.
*G01R 33/48* (2006.01)
*G01R 33/50* (2006.01)
*G01R 33/561* (2006.01)

(52) U.S. Cl.
CPC ......... *G01R 33/4824* (2013.01); *G01R 33/50* (2013.01); *G01R 33/5611* (2013.01)

(58) Field of Classification Search
CPC ................ G01R 33/50; G01R 33/5608; G01R 33/4824; G01R 33/4828; G01R 33/448; G01R 33/5602
See application file for complete search history.

(56) References Cited

U.S. PATENT DOCUMENTS

2015/0302579 A1* 10/2015 Griswold ........... G01R 33/5608 382/128
2015/0346301 A1* 12/2015 Cauley .................. G01R 33/50 324/309

OTHER PUBLICATIONS

Moore, An Introduction Tutorial on KD-Trees.*
Lemasson et al, MR Vascular Fingerprinting in Stroke and Brain Tumors Models.*
McGivney, Debra F., et al. "SVD compression for magnetic resonance fingerprinting in the time domain." IEEE transactions on medical imaging 33.12 (2014): 2311-2322.

(Continued)

*Primary Examiner* — Ruifeng Pu

(57) ABSTRACT

Disclosed herein is a method obtaining a magnetic resonance image of an object, comprising obtaining a first time evolution signal from a magnetic resonance signal from the object; performing a search of a compressed dictionary of magnetic resonance fingerprints to select a magnetic resonance fingerprint representative of the first time evolution signal, wherein the selected magnetic resonance fingerprint is an exact or approximate nearest neighbor match to the first time evolution signal; obtaining a magnetic resonance parameter associated with the selected fingerprint; generating the magnetic resonance image of the object from the obtained magnetic resonance parameter; and performing a second search of the compressed dictionary using the magnetic resonance image.

24 Claims, 7 Drawing Sheets

(56) References Cited

OTHER PUBLICATIONS

Cauley, Stephen F., et al. "Fast group matching for MR fingerprinting reconstruction." Magnetic resonance in medicine 74.2 (2015): 523-528.
Ma D, Gulani V, Seiberlich N, et al. Magnetic Resonance Fingerprinting. Nature. 2013;495(7440):187-192. doi:10.1038/nature11971.
Zhao, Bo, et al. "Maximum likelihood reconstruction for magnetic resonance fingerprinting." 2015 IEEE 12th International Symposium on Biomedical Imaging (ISBI). IEEE, 2015.
Davies, Mike, et al. "A compressed sensing framework for magnetic resonance fingerprinting." SIAM Journal on Imaging Sciences 7.4 (2014): 2623-2656.
Muja, Marius, and David G. Lowe. "Fast Approximate Nearest Neighbors with Automatic Algorithm Configuration." VISAPP (1) 2.331-340 (2009): 2.
Pierre, Eric Y., et al. "Multiscale reconstruction for MR fingerprinting." Magnetic resonance in medicine 75:2481-2492 (2016).

* cited by examiner

ITERATIVE MAGNETIC RESONANCE FINGERPRINTING RECONSTRUCTION

CROSS REFERENCE TO RELATED APPLICATIONS

This application claims the benefit of U.S. Provisional Application Ser. No. 62/245,566, filed Oct. 23, 2015, which is incorporated herein by reference in its entirety.

BACKGROUND OF THE INVENTION

The present disclosure relates generally to magnetic resonance fingerprinting (MRF), and in particular to increase quality of iterative MRF and to decrease reconstruction time for iterative MRF.

Magnetic resonance fingerprinting is a technique for multi-parametric quantitative imaging. The technique aims to obtain multiple parameters, such as spin-lattice relaxation time (T1) (also known as the longitudinal relaxation time), spin-spin transverse relaxation time (T2) (also known as the transverse relaxation time), proton density (PD), and the like, for a test object by applying a series of excitations to a test object, acquiring a signal response of the object to the series of excitations, and matching the undersampled signal response to a simulated response found in a dictionary or database of possible simulated responses.

Each simulated response stored in the dictionary is generated by running Bloch equations with relevant values for magnetic resonance parameters (T1, T2, PD, and the like). Once a match is found between the undersampled signal response and a simulated response in the dictionary, the magnetic resonance parameters (T1, T2, PD, and the like) corresponding to the matched simulated response can be retrieved from the dictionary and used for further imaging purposes. For a single iteration, the amount of data in an MR signal is not enough to provide a match to the dictionary entry with sufficient accuracy. Iterative processes are therefore employed to help refine the dictionary matching process. However, iterative processes require the repetition of various computationally expensive steps, such as dictionary search steps and signal comparison steps.

SUMMARY

Disclosed herein is a method for obtaining a magnetic resonance image of an object, comprising obtaining a compressed image from one or more magnetic resonance k-space signals obtained from the object; obtaining a first time evolution signal from the compressed image; performing a search of a compressed dictionary of magnetic resonance fingerprints to select a magnetic resonance fingerprint representative of the first time evolution signal, wherein the selected magnetic resonance fingerprint is an approximate fingerprint match to the first time evolution signal; obtaining a magnetic resonance parameter associated with the selected fingerprint; generating the magnetic resonance image of the object from the obtained magnetic resonance parameter; and performing a second search of the compressed dictionary using the magnetic resonance image.

Disclosed herein too is a computer program storage medium comprising a non-transitory computer readable medium having program code executable by a processing circuit for implementing a method for forming a magnetic resonance image of an object, the program code comprising an instruction to obtain a compressed image form one or more k-space signals obtained from the object; an instruction to obtain a first time evolution signal from the compressed image; an instruction to perform a search of a compressed dictionary of magnetic resonance fingerprints to select a magnetic resonance fingerprint representative of the first time evolution signal, wherein the selected magnetic resonance fingerprint is an approximate fingerprint match to the first time evolution signal; an instruction to obtain a magnetic resonance parameter associated with the selected fingerprint; an instruction to generate the magnetic resonance image of the object from the obtained magnetic resonance parameter; and an instruction to perform a second search of the compressed dictionary using the magnetic resonance image.

Disclosed herein too is an apparatus for obtaining a magnetic resonance image of an object, comprising a magnetic resonance device for obtaining one or more magnetic resonance k-space signals from the object; and a processor configured to: obtain a compressed image from the one or more k-space signals; obtain a first time evolution signal from the compressed image; perform a search of a compressed dictionary of magnetic resonance fingerprints to select a magnetic resonance fingerprint representative of the first time evolution signal, wherein the selected magnetic resonance fingerprint is an approximate fingerprint match to the first time evolution signal; obtain a magnetic resonance parameter associated with the selected fingerprint; generate the magnetic resonance image of the object from the obtained magnetic resonance parameter; and perform a second search of the compressed dictionary using the magnetic resonance image.

The above features and advantages and other features and advantages of the invention are readily apparent from the following detailed description of the invention when taken in connection with the accompanying drawings.

BRIEF DESCRIPTION OF THE DRAWINGS

Referring to the exemplary non-limiting drawings wherein like elements are numbered alike in the accompanying Figures.

DETAILED DESCRIPTION OF THE INVENTION

Figure 1:
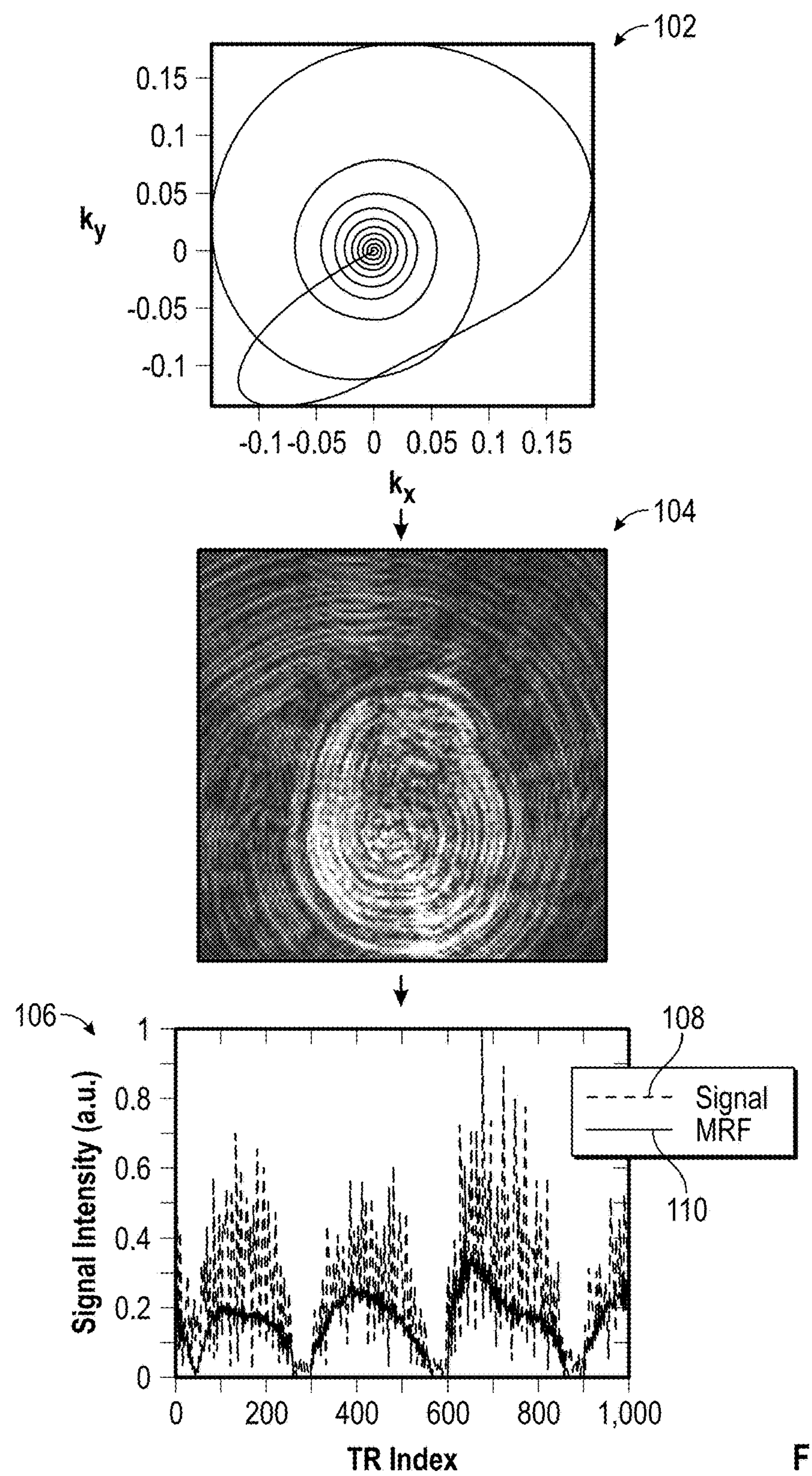
FIG. 1 illustrates a method of magnetic resonance fingerprinting (MRF) in one embodiment.

Although the following detailed description contains many specifics for the purposes of illustration, anyone of ordinary skill in the art will appreciate that many variations and alterations to the following details are within the scope of the claims. Accordingly, the following example embodiments are set forth without any loss of generality to, and without imposing limitations upon, the claimed invention.

Disclosed herein is a method for imaging an object using accelerated iterative reconstruction for magnetic resonance fingerprinting (AIR-MRF) methods. The object is generally tissue from a living being. The method comprises obtaining a time evolution signal from a magnetic resonance signal of the object and performing a search of a compressed dictionary of magnetic resonance fingerprints to select a magnetic resonance fingerprint representative of the time evolution signal. In an embodiment, the selected magnetic resonance fingerprint is a nearest neighbor match to the time evolution signal. Magnetic resonance parameters associated with the selected fingerprint are obtained. A magnetic resonance image of the object is generated from the obtained magnetic resonance parameter.

Magnetic resonance fingerprinting (MRF) is a process for determining relevant magnetic resonance parameters of an object by matching a magnetic resonance response signal obtained from an experiment or test performed on the object to a magnetic resonance response signal stored in a database. In its simplest form, MRF is analogous to matching a person's real fingerprint to a database of fingerprints. Once a match between a fingerprint sample and a fingerprint stored in a database has been made, a host of additional information about the person such as name, address and phone number can be obtained. In MRF, experimentally-acquired magnetic resonance imaging data is compared to simulated magnetic resonance imaging data (also referred to herein as a "fingerprint") stored in a fingerprint database or fingerprint dictionary. Once a match is made, various magnetic resonance parameters can be retrieved from the dictionary, including spin-lattice relaxation time (T1), spin-spin relaxation time (T2), off-resonance frequency, proton density (PD), perfusion, and magnetization transfer (MT) as well as other magnetic resonance parameters. Magnetic resonance images can be generated using the selected magnetic resonance parameters.

In one embodiment, the experimentally-acquired magnetic resonance imaging data is a time evolution signal and the fingerprints stored in the dictionary are simulated time evolution signals. The simulated time evolution signals are created by applying the Bloch equation for magnetic resonance to all foreseeable combinations of magnetic resonance parameters such as, for example, the magnetic parameters listed above ($T_1$, $T_2$, off-resonance frequency, proton density, perfusion, magnetization transfer). A dictionary entry includes the fingerprint (i.e., the simulated time evolution signal) as well as the corresponding magnetic resonance parameters used in the Bloch equation to produce the fingerprint. Once this dictionary of fingerprints has been generated, a matching algorithm can be used to find a fingerprint that best or suitably matches the acquired time evolution signal. The magnetic resonance parameters associated with the matched fingerprint can then be retrieved from the dictionary.

FIG. 1 illustrates a method of magnetic resonance fingerprinting (MRF) in one embodiment. A magnetic resonance (MR) k-space signal 102 is obtained using a pseudorandom excitation signal to excite the nuclei of the object being tested. The pseudorandom excitation signal includes a plurality of rotation pulses characterized by various acquisition parameters such as flip angle (FA), phase of RF pulses, repetition time (TR), echo time (TE), and the like. These acquisition parameters are varied during data collection in a pseudorandom manner. Each pulse rotation of the excitation signal causes the nuclei to produce a signal 102 that takes the form of a spiral in k-space. The excitation signal includes a plurality of rotation pulses, leading to the creation of a plurality of spiral signals 102. In the embodiments discussed herein, the number of rotation pulses can vary from 50 to 1000. However, this is not meant to limit the invention. Each spiral signal 102 can be used to create an image 104 of the object via a Fourier transform. Thus, an image 104 is created for each rotation pulse of the excitation signal. Image 104 is generally of a poor quality due to signal undersampling. However, the information within the plurality of images 104 can be used to select fingerprints from a fingerprint dictionary, as is detailed below.

The images 104 can be two-dimensional or three-dimensional images, in various embodiments. A time evolution signal can be formed using signals selected from a same pixel or voxel position of each of the plurality of images, for example, the voxel at the lower left corner of each of the plurality of images. The time evolution signal for the selected voxel position is compared to fingerprints stored in the dictionary in order to determine magnetic resonance parameters associated with the selected voxel position.

Graph 106 shows a time evolution signal 108 obtained from experiment as well as a simulated time evolution signal or fingerprint 110 selected from a fingerprint dictionary. While the time evolution signal 108 displays various spikes and other noise features, the fingerprint 110 is devoid of such noise. A search method discussed below is used to compare the fingerprint 110 to the time evolution signal 108 to determine whether the fingerprint is a suitable match for the time evolution signal 108. Once a selected fit is determined between time evolution signal 108 and fingerprint 110, the magnetic resonance parameters (e.g., T1, T2, PD, and the like) associated with the matched fingerprint can be retrieved from the dictionary.

Figure 2:
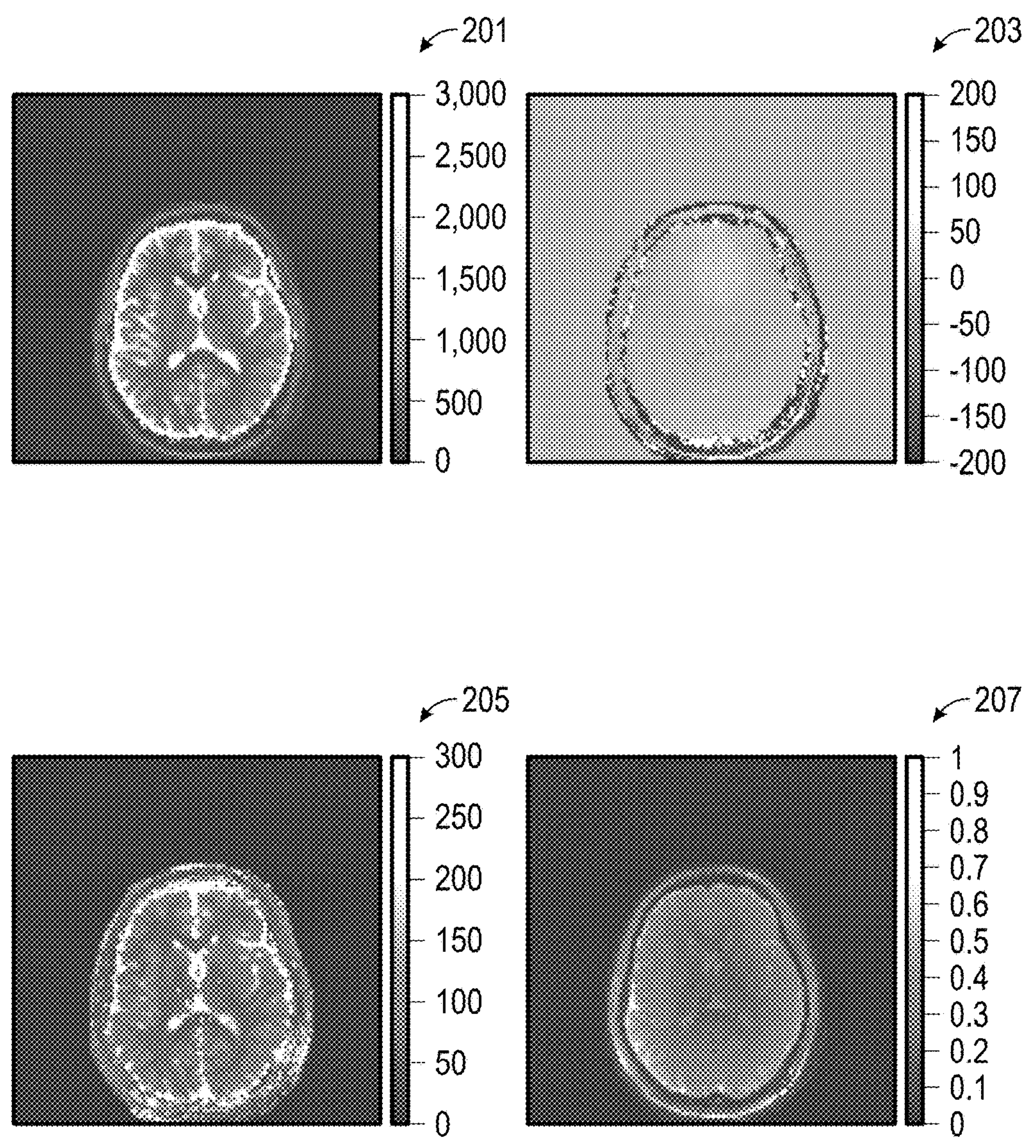
FIG. 2 shows various images based on parameters retrieved from a fingerprint dictionary using the method disclosed herein.

This matching process is performed for substantially all voxels in the sequence of images in order to retrieve MR parameters for each voxel. Once this process has been performed for all voxel positions for a selected MR parameter, the voxels can be combined to create an image for the selected MR parameter. FIG. 2 shows various images based on retrieved MR parameters. Image 201 is based on the T1 parameter. Image 205 is based on the T2 parameter. Image 203 is based on the off-resonance frequency. Image 207 is based on the spin density ($M_0$).

Figure 3:
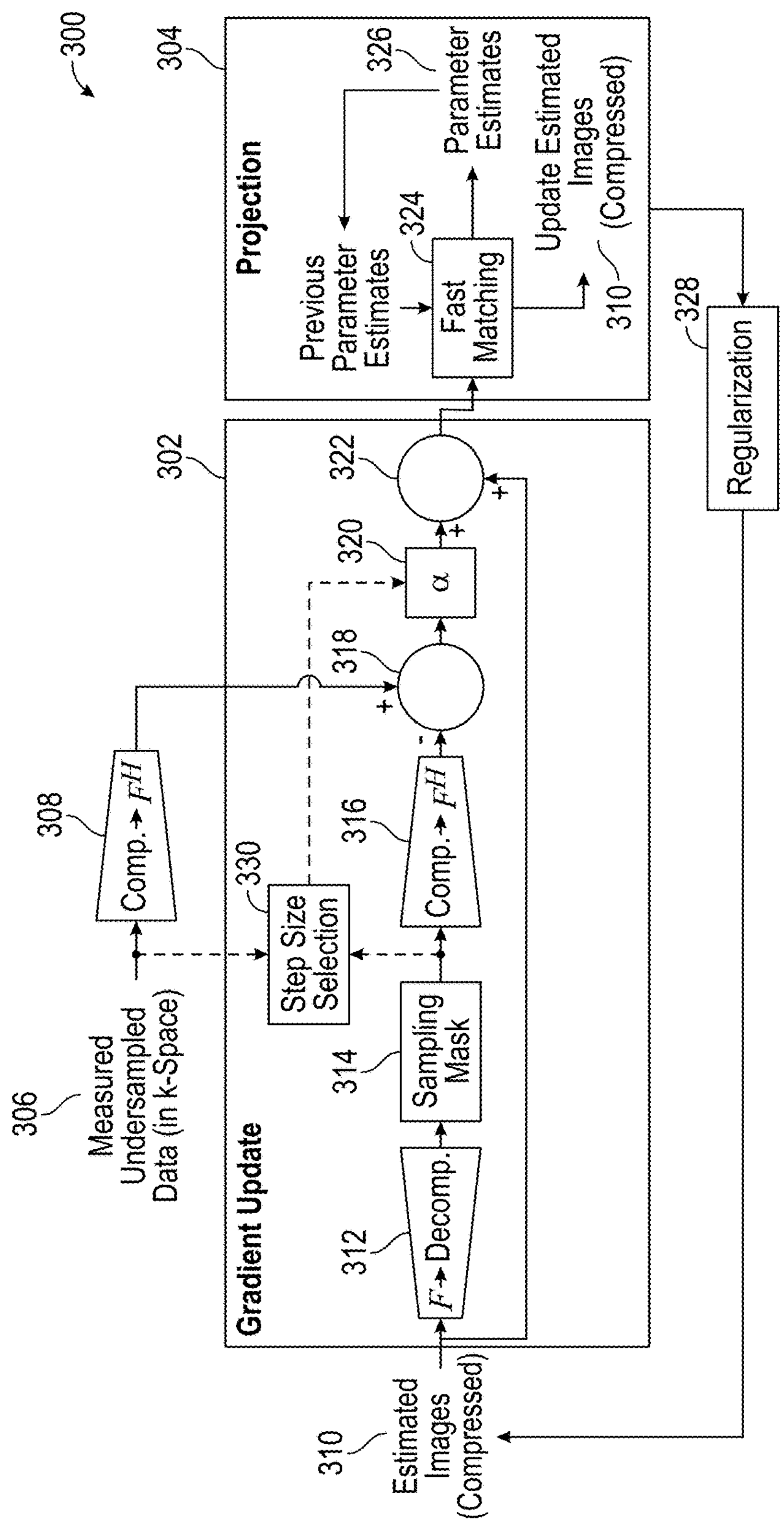
FIG. 3 shows a schematic diagram of an iterative method for reconstructing an image using MRF.

FIG. 3 shows a schematic diagram 300 of an iterative method for reconstructing an image using MRF, referred to herein as accelerated iterative reconstruction for magnetic resonance fingerprinting (AIR-MRF). The method includes a data fidelity stage 302 and a signal matching stage 304. In the data fidelity stage 302, an MR k-space signal is prepared to provide data for a dictionary search that occurs in the signal matching stage 304. Each iteration of the method provides a result from the signal matching stage 304 for input to the data fidelity stage 302 for the next iteration. Through iteration, the MR k-space signal can be used to update or modify an image previously generated at the signal matching stage 304.

In a first iteration, one or more undersampled k-space signals are received at box 306, the undersampled k-space signals being separated temporally. At box 308, the undersampled k-space signals 306 are compressed and an inverse Fourier transform is performed in order to obtain one or more images in a compressed space from the one or more undersampled k-space signals 306. The one or more compressed images can be stored at a memory location and can be retrieved during subsequent iterations. Continuing through the data fidelity stage 302, the one or more images in the compressed space are provided to a difference generator 318 that determines a difference between the one or more compressed images and one or more compressed images from a previous iteration. Since this is the first iteration, the "previous" one or more compressed images can be a null images or images that are initialized to include non-zero values, such as a temporal average of image values. The one or more compressed images created at the difference generator 316 are scaled by a factor or "step size" a at scaling box 320. The scaled one or more images are then used to update the one or more images from the previous iteration at a summing device 322. The one or more updated images are then provided to the signal matching stage 304.

For second and subsequent iterations, one or more compressed images 310 created during the signal matching stage 304 during a previous iteration are output from the signal matching stage 304 and are provided as input to the data fidelity stage 302. In box 312, the previous one or more compressed images 310 undergo a Fourier transform to obtain k-space data and the resulting k-space data is decompressed. In box 314, a sampling mask is applied to the decompressed k-space data. The sampling mask creates an undersampled data set in k-space which is compared (at box 330) to the measured undersampled k-space signals from box 306 in order to determine a scalar difference between them. This scalar difference is used to determine the step size a for box 320. This scaling can be applied once at the second iteration or every time for the subsequent iterations. In box 316, the undersampled data from box 314 is compressed and a Fourier transform is performed in order to obtain one or more compressed images. Imaging issues that occur due to multichannel coil sensitivities that occur during MR data acquisition can be resolved at these stages. In one embodiment, the resolution of such imaging issues occurs during the Fourier transform. At difference generator 318, the one or more compressed images from box 316 are subtracted from the one or more compressed images from box 308 in order to generate an image gradient. In one embodiment, the one or more compressed images from box 308 are images that were stored in a memory location or memory storage device during the first iteration. Thus, there is no need during the second and subsequent iterations to once again perform the steps of boxes 306 and 308, although one can perform these steps in alternate embodiments. In box 320, the image gradient is scaled by the determined step size a. The scaled image gradient and the one or more previous images 310 are supplied to summing device 322. Summing device 322 adds the scaled imaged gradient to the one or more previous images 310 to obtain one or more updated images. The one or more updated images are then supplied from the summing device 322 to the signal matching stage 304.

For all iterations, the signal matching stage 304 receives the one or more updated images from the data fidelity stage 302, determines a time evolution signal for the one or more images and performs a dictionary search to locate a fingerprint that is an acceptable match to the time evolution signal. Since the one or more updated images received at the signal matching stage 304 are compressed images, the time evolution signal obtained from the one or more images is a compressed time evolution signal that is not necessarily temporally consistent. However, it is possible to construct a temporally-consistent time evolution signal from the compressed time evolution signal. Once a fingerprint has been selected, the magnetic resonance parameters 326 associated with the fingerprints can be retrieved from the dictionary. The retrieved parameters 326 can be used to generate one or more compressed images 310. In various embodiments, the one or more compressed images 310 can be further modified by a regularization step (box 328). In one embodiment of the regularization step (box 328), an image is generated using one or more of the MR parameters 326 retrieved from the database and the image is multiplied by an associated fingerprint in order to modify the compressed images 310. The generated compressed images 310 are provided as input to the data fidelity stage 302. The retrieved parameters 326 can be stored at a memory location or memory storage device and used in subsequent iterations of the signal matching stage 304 to facilitate a subsequent search of the dictionary.

The dictionary search of the signal matching stage 304 includes a step for comparing data and a searching algorithm that determines how to navigate through the dictionary efficiently to locate an optimal or nearest neighbor fingerprint for the time evolution signal. Both the comparison step and the search step can be computationally expensive.

In one aspect, the method disclosed herein reduces computation time for comparing data by compressing dictionary entry data to obtain a representation of the dictionary entry in a more compact space. Various compression methods may include a singular value decomposition (SVD) or principal component analysis (PCA). In one embodiment, singular value decomposition (SVD) is used on the dictionary fingerprints in order to reduce the computation time for matching experimentally-acquired time evolution signals to fingerprints and for performing the various Fourier transforms of the data fidelity stage 302 and the signal matching stage 304. SVD can be performed on the dictionary fingerprints prior to obtaining any MR k-space signals.

In order to determine a quality of fit between a time evolution signal and a fingerprint, an inner product is performed to obtain a value $k_i$, the inner product taking the form of Eq. (1):

$$\hat{k}_i = \underset{k_j}{\operatorname{argmax}} \frac{Re\langle D_j, X_i\rangle}{\|D_j\|^2} \qquad \text{Eq. (1)}$$

where $D_j$ is the $j^{th}$ dictionary fingerprint and $X_i$ is the time evolution signal. Comparing the values of $\hat{k}_j$ for multiple dictionary entries allows one to locate a fingerprint $\hat{k}_i$ that is an acceptable fit to the time evolution signal. Mathematically, the dictionary D can be denoted by $D \in \mathbb{C}^{nxt}$ where n is the number parameter combinations and t is the number of time points. The $j^{th}$ entry (or $j^{th}$ fingerprint) is denoted by $D_j$ wherein j=1, . . . , n. For an observed time evolution signal, its dictionary match is determined by Eq. (1) above.

Every matrix $A \in \mathbb{C}^{pxq}$ can be written using SVD such that $$A = U\Sigma V^* \qquad \text{Eq. (2)}$$

where $U \in \mathbb{C}^{pxp}$ and $V \in \mathbb{C}^{qxq}$ are unitary matrices, and $\Sigma \in R^{pxq}$ is a diagonal matrix containing the non-increasing singular values $\sigma_{i,\ i=}1, \ldots, \min\{p,q\}$. The columns of U are denoted $u_1, \ldots, u_p$ and are called the left singular vectors. The columns of V are denoted $v_1, \ldots, v_q$ and are called the right singular vectors.

Since $D \in \mathbb{C}^{pxq}$, SVD can be applied to the dictionary D of fingerprints as shown in Eq. (3):

$$D = U\Sigma V^* \qquad \text{Eq. (3)}$$

where U, V, and Σ are as described above. For a given index j (1≤j≤r, where r=rank(D)), a truncated SVD can be written in matrix form to yield a low-rank approximation of the dictionary:

$$D \approx U_j \Sigma_j V_j^* \quad \text{Eq. (4)}$$

where $U_k=[u_1, \ldots, u_j]$ denotes the matrix containing the first j left singular vectors and similar matrices are formed for $\Sigma_j$ and $V_j$.

The first j right singular vectors $\{v_1, \ldots, v_j\}$ form an orthonormal basis for the rows of D. Therefore each dictionary entry $D_j$ can be written as a linear combination of these orthogonal vectors. By projecting the dictionary onto the subspace spanned by the first j right singular vectors $\{v_1, \ldots, v_j\}$, the dictionary is reduced to a compressed dictionary in a lower-dimensional space $\mathbb{C}^k$ that can be written as $$D_j = DV_j \quad \text{Eq. (5)}$$

Meanwhile, the time evolution signal $X_j$ can be projected onto the same subspace spanned by the vectors in $V_j$ by $$X_j = XV_j \quad \text{Eq. (6)}$$

The compressed dictionary $D_j$ and the SVD of the signal $X_j$ can be used in Eq. (1) to reduce computation time and cost for fingerprint selection, as discussed below with respect to FIG. 4.

Figure 4:
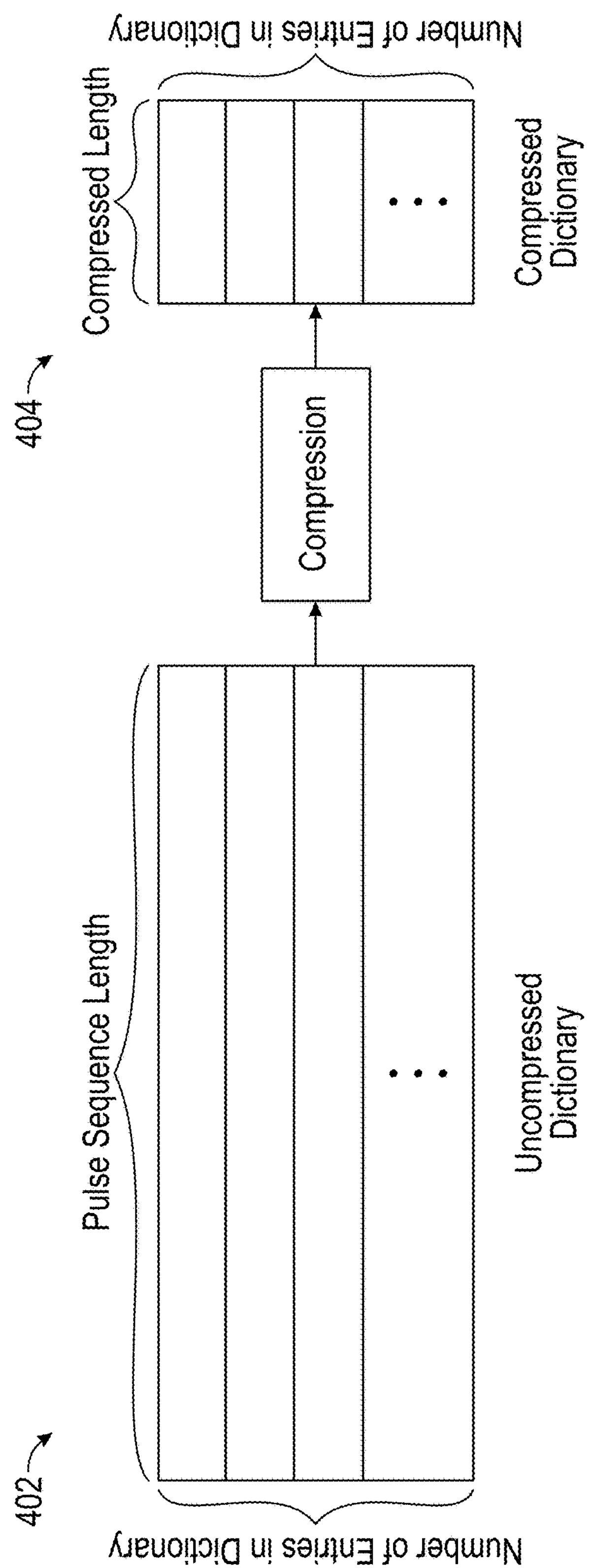
FIG. 4 schematically illustrates an effect of singular value decomposition in compressing a fingerprint dictionary.

FIG. 4 schematically illustrates an effect of singular value decomposition on the dictionary. The size of uncompressed dictionary 402 is indicated by the number of entries in the dictionary 402 and the length of the pulse sequence. The size of compressed dictionary 404 is indicated by the number of entries in the compressed dictionary 404 and a compressed length. The number of entries in the compressed dictionary 404 is the same as the number of entries in the uncompressed dictionary 402. However, the length of each entry in the compressed dictionary 404 is less than the length of each entry in the uncompressed dictionary 402. This reduced length subsequently reduces the computation time and cost for performing the calculation of Eq. (1).

In another aspect, the method disclosed herein reduces computation time and energy spent on a searching algorithm by allowing the selection of an approximate nearest-neighbor entry rather than an optimal fingerprint. Due to the large number of dictionary entries, a search algorithm is employed to increase the efficiency in locating an optimal or near-optimal fingerprint from the dictionary. An exemplary search algorithm includes a k-d tree search algorithm that includes defining a k-d tree over the dictionary space and performing a search using the k-d tree. The k-d tree is a binary tree in which every node is a k-dimensional point. The k-d tree begins at a root node, which indicates an entire search space and includes multiple nodes which facilitate the search process. A branch of the k-d tree ends in a leaf, indicating a dictionary entry or fingerprint. Every non-leaf node can be thought of as implicitly generating a splitting hyperplane that divides the search space into two parts, known as half-spaces. In other words, the search space of the dictionary is separated by a number of binary space partitions, as discussed with respect to FIG. 5.

Figure 5:
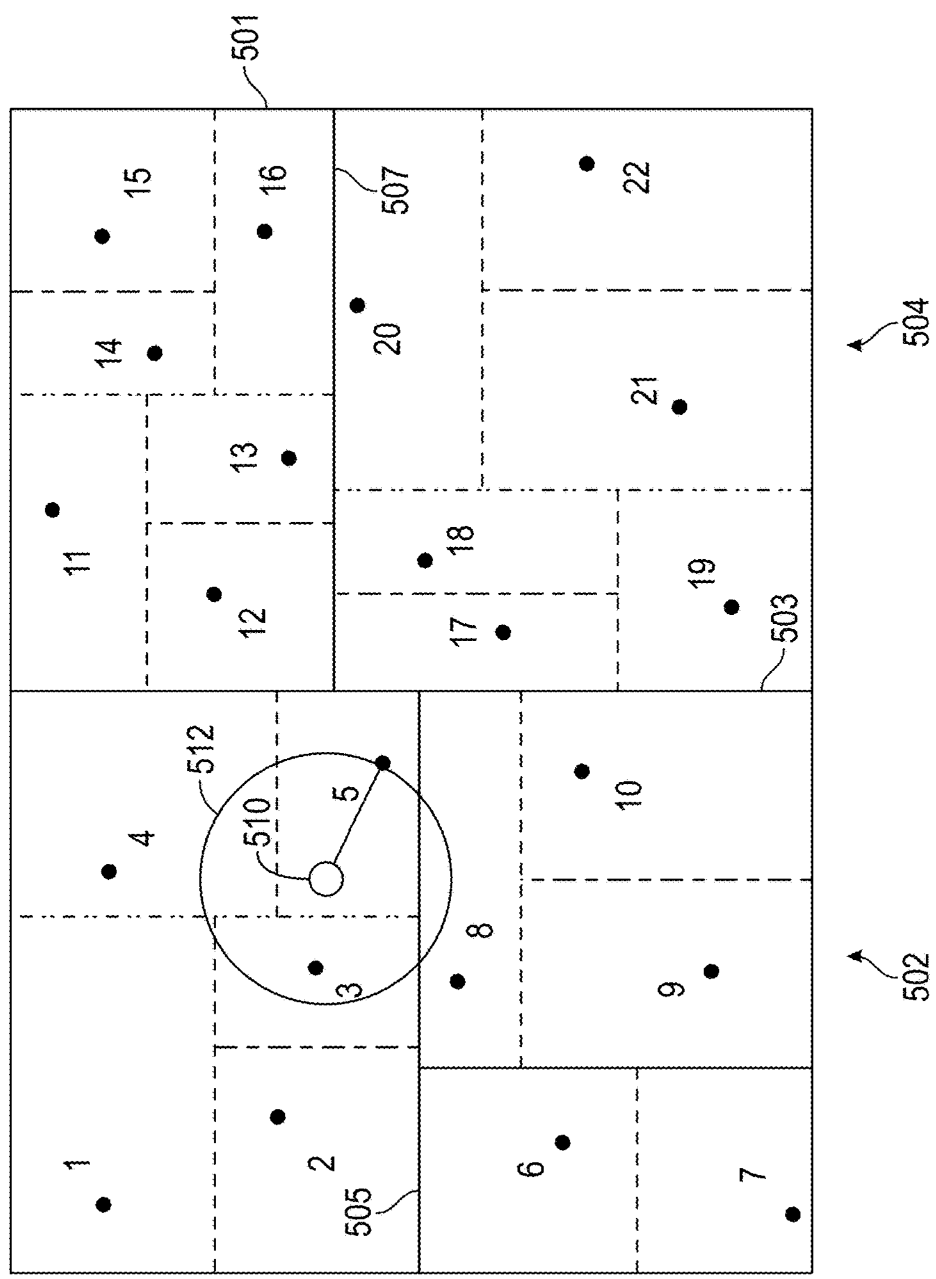
FIG. 5 shows a method of k-d tree construction for a search space.

FIG. 5 shows a method of k-d tree construction for a search space with a simplified two-dimensional example (k=2). The search space represents an entire search space of the dictionary. The search space is represented by the large rectangle 501 and is occupied by dictionary entries, represented by data points 1 through 22. The search space 501 is partitioned by plane 503 into a left half-space 502 including data points 1 through 10 and a right half-space 504 including data points 11 through 22. The left half-space 502 is further partitioned into two smaller spaces by plane 505, one of which includes data points 1-5 and the other of which includes data points 6-10. Similarly, the right half-space is further divided into two smaller spaces by plane 507, one of which includes data points 11-16 and the other of which includes data points 17-22. This method of binary partitioning of spaces can be continued any number of times, including until each data point resides uniquely in its own search space.

Figure 6:
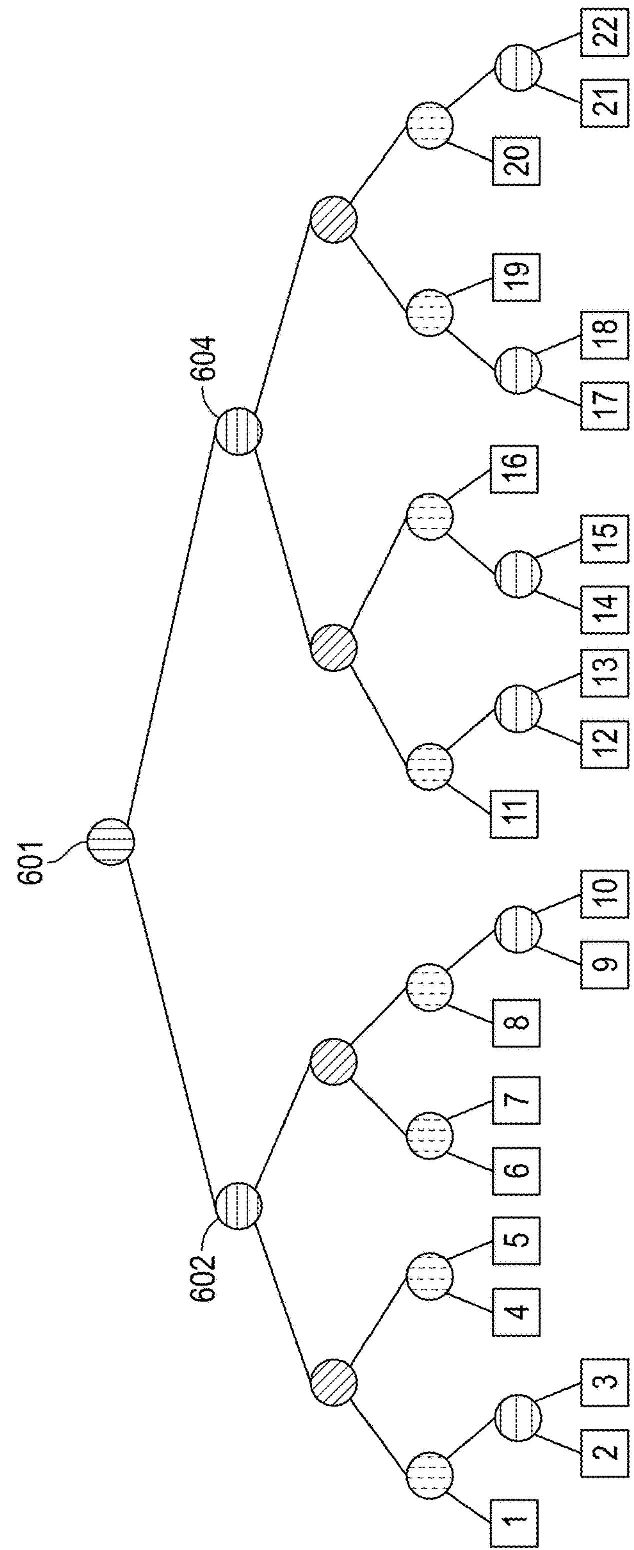
FIG. 6 illustrates a search method for selecting data points in the search space of FIG. 5 using k-d tree branching method.

FIG. 6 shows a search method for selecting data points shown in FIG. 5 using the k-d tree branching method. Node 601 is a root node representing a search over the entire search space 501. Node 602 represents left half-space 502 and node 604 represents right half-space 504.

An operation is performed at node 601 to decide which of the search spaces (502, 504) to select. The operation provides values for a comparison between a time evolution signal and a representative time evolution signal of the left half-space 502 as well as for between the time evolution signal and a representative time evolution signal of the right half-space 504. A comparison of these values determines whether to continue the search in the left half-space 502 (node 602) or the right half-space 504 (node 604). At each node, another set of operations and comparisons is made to determine which of the next lowest nodes to search. In a first part of the search, this process continues until a leaf is has been located. Once the leaf has been located, nearby leaves are evaluated in order to determine an optimal match. Referring to FIG. 5, a query point 510 representing a time evolution signal is shown residing in a search space for data point '5'. However, it is possible that another data point (such as data point '3') provides a closer match. Therefore, in a second part of the search, a hypersphere 512 is drawn about the query point 510 with radius defined by the point initially selected from the first part of the search (i.e., leaf '5'), and data points in spaces intersecting with this hypersphere 512 are checked to determine an improved or optimal match with the time evolution signal. In one aspect of the present invention, the second part of the search is limited in extent so that only a selected number of the data points within the hypersphere 512 are checked during any given iteration of the AIR-MRF shown in FIG. 3. During subsequent iterations of AIR-MRF, the first part of the search can be performed with a new query point to locate a new leaf and a new hypersphere can be defined with respect to the new query point for the second part of the search. The radius of the new hypersphere can be a minimum of the distance between the new query and the new leaf located during the first part of the search and the distance between the new query and the leaf located during the previous first stage. The new hypersphere can be used to immediately eliminate some candidate points, thus improving search results and/or reducing search time. In one embodiment, when the query point during one iteration does not change much from the query point in the previous iteration, it is possible to skip the first part of search for subsequent iterations in order to speed up the search process. However, maintaining the first part of the search provides an insignificant time penalty, even if the query point changes significantly. Meanwhile, removing the first stage can degrade search results for when the query point changes significantly.

In one embodiment, a fingerprint dictionary is compressed using singular value decomposition, and the search algorithm is performed using compressed fingerprints of the compressed dictionary when searching through the dictionary. The search algorithm used in navigating the dictionary includes the k-d tree search discussed above. The search algorithm can be stopped before an optimal fingerprint is selected from the database. The fingerprint found during this truncated search is therefore an approximate fingerprint to an optimal fingerprint selection rather than the optimal fingerprint selection itself Computation time is therefore reduced both by using the compressed dictionary and by modifying the search algorithm to accept approximate fingerprints rather than optimal fingerprints. Fourier transform times are further reduced by use of SVD compression, since the linearity of the compression allows the Fourier operations to be performed on a reduced set of compressed data.

The approximate fingerprint can be used in subsequent iterations of the AIR-MRF shown in FIG. 3. In other words, once the approximate fingerprint is selected, magnetic resonance parameters (i.e., T1, T2, PD, and the like) associated with the approximate fingerprint are selected from the compressed dictionary to form compressed images. The compressed images are then input to the data fidelity stage 302 of FIG. 3.

While the parameters obtained for an approximate fingerprint can be different than the parameters obtained for an optimal fingerprint, the iterative process of FIG. 3 is stable to such differences. For subsequent iterations the search algorithm can search for better approximate fingerprints.

While an exhaustive search would require checking all possible matches within this hypersphere 512, which in some cases could involve searching every single leaf node in the tree, the truncated search disclosed herein for selecting approximate fingerprints reduces search time by checking only a fixed number of leaf nodes within the hypersphere 512 for any one iteration. The best match after a limited number of leaf node checks is considered the approximate match to the time evolution signal. In one embodiment, the selected number of the data points to check can vary with each iteration.

The number of data points to check can be different with each iteration to adjust for quality and performance.

During iterative MRF reconstruction, we can assume that the parameter estimates for a given voxel will not typically change drastically from one iteration to the next. Thus, for the second and subsequent iterations, the approximate fingerprint selected during the previous iteration is used as an initial guess for the closest dictionary match. This eliminates data points of the k-d tree that do not contain closer matches. By incorporating this prior information, the search process is accelerated beyond what can be obtained using conventional k-d tree searches.

Figure 7:
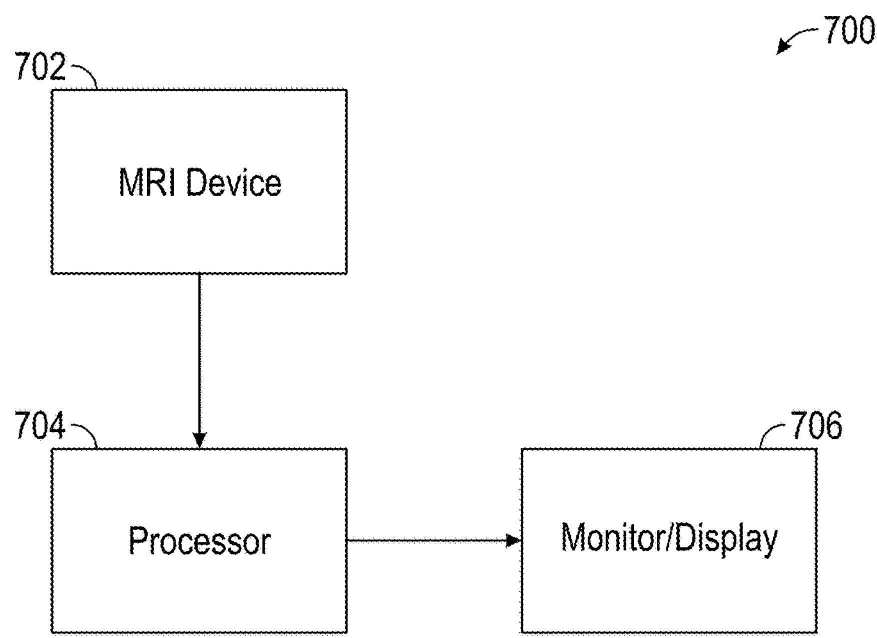
FIG. 7 shows a schematic diagram of an apparatus for providing a magnetic resonance image of an object in one embodiment.

FIG. 7 shows a schematic diagram of an apparatus 700 for providing a magnetic resonance image of an object in one embodiment. The object is placed in the MRI device 702 which applies the excitation pulse having acquisition parameters that are varied in a pseudorandom manner. The data from the MRI device 702 is sent to processor 704 which performs the AIR-MRF process shown in FIG. 3. The processor 704 also produces a compressed fingerprint dictionary and performs the nearest neighbor search on the compressed dictionary. In various embodiments, the compressed fingerprint dictionary is computed prior to the iterative methods disclosed in FIG. 3 and is stored in a memory location or memory storage device so as to be accessible to processor 704. Images formed by the processor can be shown at monitor/display 706 for review by a technician or medical personnel perform a diagnosis on the object.

In view of the foregoing, it will be appreciated that an embodiment may be embodied in the form of computer-implemented processes and apparatuses for practicing those processes. An embodiment may also be embodied in the form of a computer program product having computer program code containing instructions embodied in tangible media, such as floppy diskettes, CD-ROMs, hard drives, USB (universal serial bus) drives, or any other computer readable storage medium, such as random access memory (RAM), read only memory (ROM), erasable programmable read only memory (EPROM), electrically erasable programmable read only memory (EEPROM), or flash memory, for example, wherein, when the computer program code is loaded into and executed by a computer, the computer becomes an apparatus for practicing the invention. An embodiment may also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the claims. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed example embodiments and, although specific terms may have been employed, they are unless otherwise stated used in a generic and descriptive sense only and not for purposes of limitation, the scope of the claims therefore not being so limited. Moreover, the use of the terms first, second, and the like do not denote any order or importance, but rather the terms first, second, and the like are used to distinguish one element from another. Furthermore, the use of the terms a, an, and the like do not denote a limitation of quantity, but rather denote the presence of at least one of the referenced item.

Additionally, the term "comprising" as used herein does not exclude the possible inclusion of one or more additional features.

What is claimed is:

1. A method for obtaining a magnetic resonance image of an object, comprising:

obtaining a compressed image from one or more magnetic resonance k-space signals obtained from the object;

obtaining a first time evolution signal from the compressed image;

performing a first search of a compressed dictionary of magnetic resonance fingerprints to select a magnetic resonance fingerprint representative of the time evolution signal, wherein the selected magnetic resonance fingerprint is an approximate fingerprint match to the first time evolution signal;

obtaining a magnetic resonance parameter associated with the selected fingerprint;

generating the magnetic resonance image of the object from the obtained magnetic resonance parameter;

updating the generated magnetic resonance image using the obtained compressed image; and performing a second search of the compressed dictionary using the updated magnetic resonance image.

2. The method of claim 1, wherein an entry of the compressed dictionary includes a singular value decomposition of a fingerprint.

3. The method of claim 2, wherein selecting the representative magnetic resonance fingerprint further comprises comparing a singular value decomposition of the first time evolution signal to the singular value decomposition of the fingerprint.

4. The method of claim 3, further comprising calculating a distance using the singular value decomposition of the first time evolution signal and the singular value decomposition of the fingerprint.

5. The method of claim 1 wherein the obtained magnetic resonance parameters include at least one of (i) a spin-lattice relaxation; (ii) a spin-spin relaxation; (iii) a proton density; (iv) a spin density; and (v) an off-resonance frequency.

6. The method of claim 1, wherein performing the first search further comprises performing a k-d tree search of the compressed dictionary through to select a leaf node of the k-d tree and performing a search of a selected number of data points within a hypersphere of the selected leaf node to select the approximate fingerprint.

7. The method of claim 6, wherein performing the second search of data points to select a new approximate fingerprint from within a hypersphere defined by the approximate fingerprint selected during the first search.

8. The method of claim 1, further comprising applying a regularization step to the magnetic resonance image and enforcing data fidelity on the regularized magnetic resonance image by compensating for a difference between the regularized magnetic resonance image and acquired data.

9. The method of claim 1, further comprising generating a second time evolution signal from the updated magnetic resonance image and a fingerprint associated with the magnetic resonance image and performing the second search of the compressed dictionary using the second time evolution signal.

10. A computer program storage medium comprising a non-transitory computer readable medium having program code executable by a processing circuit for implementing a method for forming a magnetic resonance image of an object, the program code comprising:

an instruction to obtain a compressed image form one or more k-space signals obtained from the object;

an instruction to obtain a first time evolution signal from the compressed image;

an instruction to perform a first search of a compressed dictionary of magnetic resonance fingerprints to select a magnetic resonance fingerprint representative of the time evolution signal, wherein the selected magnetic resonance fingerprint is an approximate fingerprint match to the first time evolution signal;

an instruction to obtain a magnetic resonance parameter associated with the selected fingerprint;

an instruction to generate the magnetic resonance image of the object from the obtained magnetic resonance parameter;

an instruction to update the generated magnetic resonance image using the one or more k-space signals obtained from the object; and an instruction to perform a second search of the compressed dictionary using the updated magnetic resonance image.

11. The computer program storage medium of claim 10, further comprising an instruction to form an entry of the compressed dictionary by performing a singular value decomposition on a fingerprint.

12. The computer program storage medium of claim 11, wherein selecting the representative magnetic resonance fingerprint further comprises comparing a singular value decomposition of the first time evolution signal to the singular value decomposition of the fingerprint.

13. The computer program storage medium of claim 12, further comprising an instruction to determine a distance using the singular value decomposition of the first time evolution signal and the singular value decomposition of the fingerprint.

14. The computer program storage medium of claim 10, wherein the obtained magnetic resonance parameters include at least one of (i) a spin-lattice relaxation; (ii) a spin-spin relaxation; (iii) a proton density; (iv) a spin density; and (v) an off-resonance frequency.

15. The computer program storage medium of claim 10, wherein performing the first search further comprises performing a k-d tree search of the compressed dictionary to select a leaf node of the k-d tree and performing a search of a selected number of data points within a hypersphere of the selected leaf node to select the approximate fingerprint.

16. The computer program storage medium of claim 15, wherein performing the second search of data points further comprises selecting a new approximate fingerprint from within a hypersphere defined by the approximate fingerprint selected during the first search.

17. The computer program storage medium of claim 10, further comprising an instruction to apply a regularization step to the magnetic resonance image and enforce data fidelity on the regularized magnetic resonance image by compensating for a difference between the regularized magnetic resonance image and acquired data.

18. The computer program storage medium of claim 10, further comprising an instruction to generate a second time evolution signal from the updated magnetic resonance image and a fingerprint associated with the magnetic resonance image and perform the second search of the compressed dictionary using the second time evolution signal.

19. An apparatus for obtaining a magnetic resonance image of an object, comprising:

a magnetic resonance device for obtaining one or more magnetic resonance k-space signals from the object; and a processor configured to:

obtain a compressed image from the one or more k-space signals; obtain a first time evolution signal from the compressed image;

perform a search of a compressed dictionary of magnetic resonance fingerprints to select a magnetic resonance fingerprint representative of the first time evolution signal, wherein the selected magnetic resonance fingerprint is an approximate fingerprint match to the first time evolution signal;

obtain a magnetic resonance parameter associated with the selected fingerprint;

generate the magnetic resonance image of the object from the obtained magnetic resonance parameter;

update the generated magnetic resonance image using the obtained compressed image; and perform a second search of the compressed dictionary using the updated magnetic resonance image.

20. The apparatus of claim 19, wherein the magnetic resonance device is configured to excite nuclei of the object using an excitation signal having parameters that are varied in a pseudorandom manner.

21. The apparatus of claim 19, wherein selecting the representative magnetic resonance fingerprint further comprises comparing a singular value decomposition of the first time evolution signal to a singular value decomposition of the fingerprint.

22. The apparatus of claim 19, wherein the processor performs the first search by performing a k-d tree search of the compressed dictionary to select a leaf node of the k-d tree and performing a search of a selected number of data points within a hypersphere of the selected leaf node to select the approximate fingerprint.

23. The apparatus of claim 19, wherein the processor applies a regularization step to the magnetic resonance image and enforces data fidelity on the regularized magnetic resonance image by compensating for a difference between the regularized magnetic resonance image and acquired data.

24. The apparatus of claim 19, wherein the processor generates a second time evolution signal from the updated magnetic resonance image and a fingerprint associated with the magnetic resonance image and performs the second search of the compressed dictionary using the second time evolution signal.

* * * * *